US008843862B2

(12) United States Patent
McElvain

(10) Patent No.: US 8,843,862 B2
(45) Date of Patent: Sep. 23, 2014

(54) METHOD AND APPARATUS FOR CREATING AND CHANGING LOGIC REPRESENTATIONS IN A LOGIC DESIGN USING ARITHMETIC FLEXIBILITY OF NUMERIC FORMATS FOR DATA

(75) Inventor: Kenneth S. McElvain, Menlo Park, CA (US)

(73) Assignee: Synopsys, Inc., Mountain View, CA (US)

( * ) Notice: Subject to any disclaimer, the term of this patent is extended or adjusted under 35 U.S.C. 154(b) by 896 days.

(21) Appl. No.: 12/336,376

(22) Filed: Dec. 16, 2008

(65) Prior Publication Data
US 2010/0153899 A1 Jun. 17, 2010

(51) Int. Cl.
*G06F 17/50* (2006.01)
*G06F 9/45* (2006.01)
*G06F 9/455* (2006.01)

(52) U.S. Cl.
CPC .................................. *G06F 17/5045* (2013.01)
USPC ............ 716/104; 716/101; 716/103; 716/132

(58) Field of Classification Search
None
See application file for complete search history.

(56) References Cited

U.S. PATENT DOCUMENTS

| 5,867,400 | A | * | 2/1999 | El-Ghoroury et al. ........ 716/101 |
| 5,898,742 | A |   | 4/1999 | Van Der Werf |
| 5,926,396 | A | * | 7/1999 | Ohara .............................. 326/80 |
| 5,937,190 | A |   | 8/1999 | Gregory et al. |
| 6,292,926 | B1 |   | 9/2001 | Fukui et al. |
| 6,468,735 | B2 |   | 10/2002 | Stiffey-Wilusz |
| 6,588,004 | B1 | * | 7/2003 | Southgate et al. ............ 716/102 |
| 6,668,364 | B2 |   | 12/2003 | McElvain et al. |
| 6,691,301 | B2 | * | 2/2004 | Bowen .......................... 717/114 |
| 6,772,399 | B2 |   | 8/2004 | Saluja et al. |
| 6,785,872 | B2 | * | 8/2004 | Carter ........................... 716/103 |
| 6,915,361 | B2 |   | 7/2005 | Alpert et al. |
| 6,978,430 | B2 |   | 12/2005 | McElvain et al. |
| 7,006,961 | B2 | * | 2/2006 | Mandell et al. ................. 703/15 |
| 7,036,106 | B1 | * | 4/2006 | Wang et al. .................... 716/104 |
| 7,162,704 | B2 |   | 1/2007 | Oktem |
| 7,234,123 | B2 | * | 6/2007 | Sachs ............................ 716/105 |
| 7,263,673 | B1 | * | 8/2007 | McElvain et al. ............. 716/103 |

(Continued)

FOREIGN PATENT DOCUMENTS

| EP | 0 769 738 A2 | 4/1997 |
| JP | 11-73449 | 3/1999 |
| JP | 11-154167 | 6/1999 |
| JP | 2000-348878 | 12/2000 |

OTHER PUBLICATIONS

T. Kim, Circuit Optimization Using Carry-Save-Adder Cells, IEEE Transactions on Computer-Aided Design of Integrated Circuits and Systems, pp. 974-984.*

(Continued)

*Primary Examiner* — A. M. Thompson
(74) *Attorney, Agent, or Firm* — HIPLegal LLP; Judith A. Szepesi

(57) ABSTRACT

Methods and apparatuses for designing logic are described. In one embodiment, a directive which specifies a numeric format for data in a data processing operation in a logic design is determined. The directive is used as a minimum format, rather than an exact or required format to create or change at least a portion of a representation of logic in the logic design to perform the data processing operation. Other methods are disclosed, and systems and machine readable media are also disclosed.

59 Claims, 10 Drawing Sheets

(56) References Cited

U.S. PATENT DOCUMENTS

| | | | |
|---|---|---|---|
| 7,296,246 B1 | 11/2007 | Kuehlmann et al. | |
| 7,346,881 B2* | 3/2008 | Wang et al. | 716/137 |
| 7,437,700 B2* | 10/2008 | Wang et al. | 716/104 |
| 7,454,732 B2 | 11/2008 | McElvain et al. | |
| 7,555,741 B1* | 6/2009 | Milton et al. | 716/101 |
| 7,802,213 B2* | 9/2010 | Oktem | 716/114 |
| 7,890,903 B2* | 2/2011 | Weber et al. | 716/106 |
| 7,917,559 B2* | 3/2011 | Redgrave | 708/232 |
| 7,937,559 B1* | 5/2011 | Parameswar et al. | 712/37 |
| 2004/0068708 A1 | 4/2004 | Sivaraman et al. | |
| 2005/0132316 A1 | 6/2005 | Suaris et al. | |
| 2005/0160402 A1* | 7/2005 | Wang et al. | 717/114 |

OTHER PUBLICATIONS

Gossett, Phil, "Quantum Carry-Save Arithmetic," Aug. 29, 1998, 12 pages.

Kim, Taewhan, et al., "Arithmetic Optimization Using Carry-Save-Adders" Proceedings of the Design Automation Conference, Jun. 15-19, 1998, 6 pages.

Zhan, Yu, et al., "Signal Representation Guided Synthesis Using Carry-Save Adders for Synchronous Data-path Circuits," DAC 2001, Las Vegas, Nevada, Jun. 18-22, 2001, 6 pages.

Kawata, Yoko et al., "An Algorithm for Generating Data Flow Graphs from Behavioral Descriptions," Journal of Information Processing Society of Japan, Oct. 20, 1995, vol. 95, No. 99 (DA-77), pp. 137-144.

Hiroyuki Ochi et al."Development of IP Library of IEEE754 Std Single-Precision Floating-Point Dividers," The Institute of Electronics, Information and Communication Engineers, Technical Report of IEICE VL02002-115, ICD2002-160, DC2002-68 (Nov. 2011) (An Algorithm for Generating Data Flow Graphs from Behavioral Descriptions), Nov. 2002, pp. 205-210 (English Abstract).

Gebotys, C.H. et al. "Optimal Mapping of DSP Applications to Architectures," System Sciences, Proceesings of the 26th Hawaii International Conference, Wailea, HI (Jan. 5-8, 1993), pp. 116-123.

Kuehlmann, A. et al. "Timing Analysis in High-Level Synthesis," Proceedings of the IEEE/ACM International Conference on Computer Aided Design (ICCAD), Santa Clara, CA (Nov. 8-12, 1992), pp. 349-354.

Parhi, Keshab K. "VLSI Digital Signal Processing Systems: Design and Implementation," Wiley-Interscience (1999), pp. 43-45 and 91-118.

PCT International Preliminary Report for PCT International Appln. No. US2004/014225, mailed Nov. 24, 2005 (8 pages).

PCT International Search Report and Written Opinion for PCT International Appln. No. US2004/014225, mailed Oct. 10, 2005 (14 pages).

European Patent Application No. 04751567.1, Official Action mailed Feb. 24, 2009, 5 pages.

Japanese Patent Application No. 2006-532839, Official Action dated Jul. 14, 2009, 10 pages.

Japanese Patent Application No. 2006-532839, Official Action mailed Dec. 22, 2009, 3 pages (English translation).

* cited by examiner

METHOD AND APPARATUS FOR CREATING AND CHANGING LOGIC REPRESENTATIONS IN A LOGIC DESIGN USING ARITHMETIC FLEXIBILITY OF NUMERIC FORMATS FOR DATA

FIELD OF THE INVENTION

This disclosure relates to the field of designing logic, such as integrated circuits (ICs) or software, for performing data processing operations. More particularly, at least certain embodiments of the inventions relate to the design of one or more ICs through a synthesis process which begins with the use of a description of a design in a high level language such as C, C++, Matlab, computation diagram such as Simulink, or a hardware description language (HDL).

BACKGROUND

Data processing operations often use numbers which can be represented in various formats. For example, digital signal processing (DSP) operations are often specified in mathematical terms using real numbers. For implementation, these real numbers are approximately represented in hardware or software in a format that has more limited range and accuracy. For example, if a number is represented as a fixed point value (as opposed to a floating point value) in binary, the number may be represented in a 16.8 format (16 bit word length with 8 bits to the right of the binary point) or in a 32.8 format, etc. Other representations such as floating point and logarithm based formats have similar tradeoffs between the size of the representation and the range and precision of the numbers that can be represented. Depending on the application, a designer of the logic for the data processing operation can reduce the size of the representation (e.g. reduce the format of the representation from 16.8 to 12.4, etc.) and thereby improve performance (e.g. in speed) and reduce implementation cost (e.g. in die area consumed in an IC). These reductions are specified as type declarations for variables in languages like System-C or as format constraints either embedded in the language or in an external constraint file for other languages. In Matlab for example, the representation of numbers is constrained through the use of calls to quantizer functions which take as input the unquantized value and parameters specifying the desired format and conversion method. The result of such a function call is the desired approximation of the input value. Quantizers may use rounding, saturation and truncation to reduce the size of the number representation. Reduced versions of floating point numbers are also possible which use fewer bits for mantissa and exponent and may also use a higher radix for the exponent.

Often, a designer may use an existing tool to analyze the quality of formats and to also choose a desired size format that meets accuracy needs, and this desired size format is treated as an exact specification of the data to be stored in the declared variable FIG. 1 shows an example of a method in the prior art for using a format directive or type declaration when designing logic, such as an IC or software. In this method, a system (e.g. a computer-aided design system driven by software) receives, in operation 101, a directive specifying one or more formats, such as the size format of data in certain data paths (e.g. inputs or outputs, etc.). The system then treats, in operation 103, the directive as a exact format during the data processing operations; for example, if the format is 16.16 for all outputs, then the largest size output never exceeds the 16.16 size and this may require saturation or rounding or truncation in the logic to limit outputs to this size (and hence be within the constraint of the target format). In operation 105, the system creates a representation of logic (e.g. a netlist in RTL or compiled software) to perform the data processing operations, where the representation is limited by the constraint of the format. This representation can be used to build logic to perform the data processing operations subject to the constraint. The use of these format directives may be considered a form of word length optimizations, which may improve the performance and area consumption of DSP implementations in software or hardware implementations by constraining word sizes (e.g. number of bits) used to represent values. Operations on smaller word sizes are often faster and smaller, so constraining the word sizes, through a format directive, does sometimes result in a smaller and faster implementation.

SUMMARY OF THE DESCRIPTION

Methods and apparatuses for designing logic, such as circuits or software, are described herein. The methods can specify and exploit arithmetic flexibility in high level synthesis as explained herein. One embodiment of a method for designing logic includes determining a directive which specifies a format for data in a data processing operation and creating a representation of logic to perform the data processing operation, wherein the creating uses the directive as a minimum accuracy requirement for at least a portion of the representation of logic. The determining of the directive may include reading the directive from a source code file. In at least certain embodiments, the method may further include storing a representation of logic in a computer storage device for use in creating at least one integrated circuit. The portion of the representation of logic may include a merged carry-save adder, and the directive may be used as a minimum accuracy requirement within internal inputs in the portion of the representation of the logic. In at least certain embodiments, the representation of the logic may include an output which has a required format which matches exactly the format specified by the directive. The format may specify information about the required range, precision and accuracy of the representation, and at least a portion of the representation of logic uses an increased range, precision and accuracy in its implementation. The method may further include saving information specifying the actual conversions chosen to numeric formats or choices of function approximations, which are different but of higher quality than the formats in the directive, used in creating the representation of logic. This information may then be used to prepare a new design description, potentially in the original input format wherein the operations are carried out in a bit accurate fashion with the optimization choices and which can be used when simulating or testing the representation of logic. The method may also include determining whether a logic optimization is to be used in creating the representation of logic, such as an optimization which involves merging of carry-save based operators; in response to determining that a logic optimization is to be implemented, any reduction in format specified by the directive is deferred in the signal path of the optimized logic. The result of the optimized logic is at least as accurate as the result achieved with the original input format.

According to another aspect of the present inventions, an embodiment of a method includes determining a level of requested accuracy for a result of a data processing operation, and selecting, based on the level of requested accuracy, an implementation of the data processing operation from a library of implementations of the data processing operation, and creating a representation of logic to provide the selected implementation. The creating, in at least certain embodiments, may include compiling a description of the logic in a hardware description language. The selected implementation may use a format directive, specified in the description, as a minimum format within at least a portion of the representation of logic. The determining may include reading the level of requested accuracy from a source code file. The representation of logic may include an output which is limited to the format directive as a required format, while signal paths within the representation of logic treat the format directive as a minimum format. This method may further include determining whether a logic optimization is to be used in creating the representation of logic and, if it is, then deferring in a signal path a reduction in format, specified by the format directive. The method may further include recording the choice of function approximation used. The recorded choices may then be used to create a new description, potentially in the original input format, for bit accurate simulation or testing. The method may also include creating, in the at least a portion of the representation of logic, data paths having a word length larger than a word length specified by the format directive if the selected implementation will consume less space or have higher performance in an integrated circuit than another implementation.

Power can also be affected by choice of numeric format. In many DSP algorithms, input values often have small swings from slightly negative values to slightly positive values. When such a swing occurs in a 2's complement fixed point format, almost all bits in the representation switch from 1 to 0, consuming considerable power. A change in numeric representation to sign magnitude will eliminate most of the switching, but results in a requirement of adding one bit to the format so that the minimum 2's complement value can be represented. This results in the new format being able to represent both more positive and more negative numbers than the original format, causing a subtle change in behavior of the computations in overflow situations. Despite this behavior change, at least certain embodiments of the present invention will make such changes automatically to designs to reduce power consumption. This change can be made, at least in certain embodiments, automatically after and in response to a determination that the design exceeds a power limit or other power requirement or otherwise needs to reduce its power consumption. For example, a design software may access or estimate a power consumption of a design and upon determining that the design's power consumption exceeds a limit or threshold, a method of the present invention can switch the design to use a sign magnitude format in response to determining that the design's power consumption exceeds the limit. This switch can occur automatically.

In this description, logic optimizations include general transforms of the design including, for example, arithmetic, algebraic, and sequential transforms of the design in addition to Boolean transforms. Further, any substitution of one expression or structure for another where the replacement expression or structure would maintain the required arithmetic accuracy will be understood as a logic optimization. Logic operations include AND, OR, NOR, NAND, XOR, etc., operations, in addition to arithmetic operations (e.g., addition, etc.) and an arithmetic optimization can be considered a logic optimization.

Other methods are also disclosed, and systems and machine readable media, such as computer readable media, are also disclosed.

BRIEF DESCRIPTION OF THE DRAWINGS

The present invention is illustrated by way of example and not limitation in the figures of the accompanying drawings in which like references indicate similar elements.

DETAILED DESCRIPTION

Various embodiments and aspects of the inventions will be described with reference to details discussed below, and the accompanying drawings will illustrate the various embodiments. The following description and drawings are illustrative of the invention and are not to be construed as limiting the invention. Numerous specific details are described to provide a through understanding of various embodiments of the present invention. However, in certain instances, well-known or conventional details are not described in order to provide a concise discussion of embodiments of the present inventions.

Figure 2:
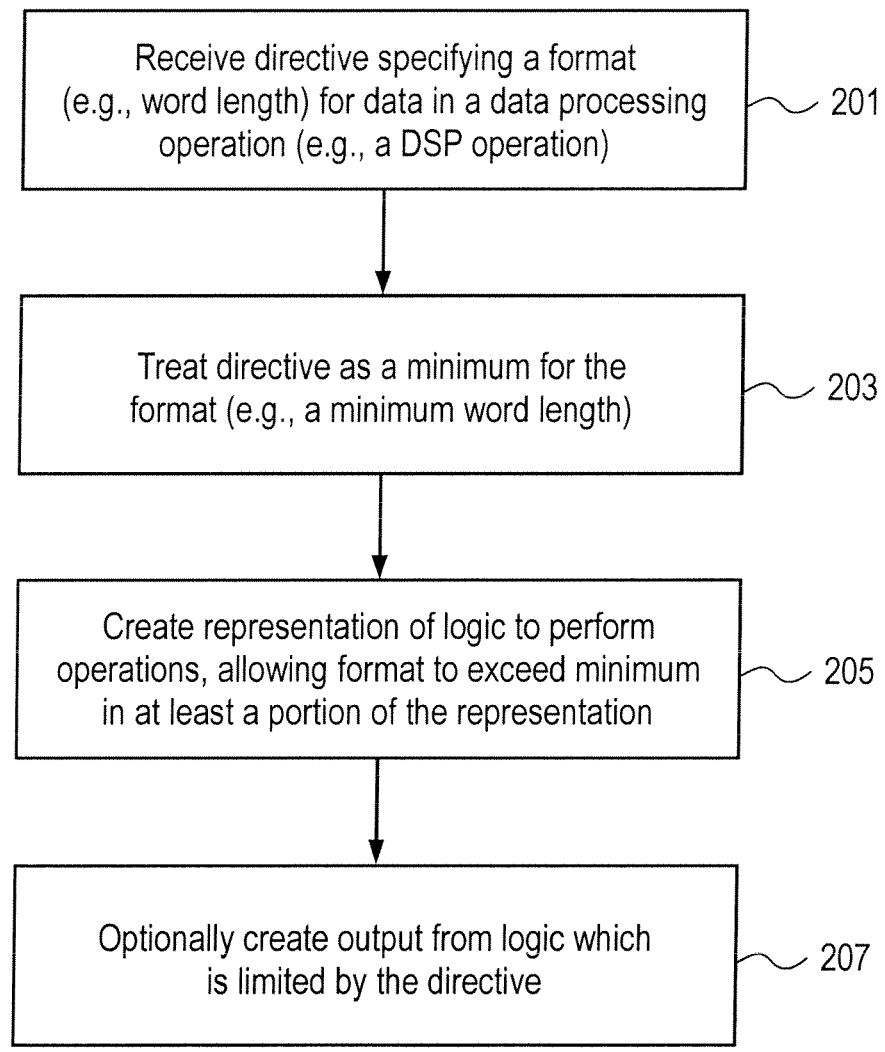
FIG. 2 is a flow chart which illustrates an example of a method of the present invention for using format directives.

Operations on smaller word sizes, as noted above, are often faster and smaller, so constraining the word sizes, through a format directive, does often result in a smaller and faster implementation, but performing these reduction operations in between certain operators (e.g. between adders) interferes with other important optimizations, such as carry-save based operator merging or the use of IP blocks in modern FPGAs and other DSP platforms. In modern FPGAs which contain DSP acceleration hardware, there may be specific hardware for a limited word length optimization, but general specifications may not be implementable, preventing use of the high-speed, high-density acceleration hardware. In short, there is a mismatch between the use of the exact specification of numeric formats and other optimizations or optimal implementations. In at least certain embodiments described herein, this mismatch is solved by interpreting the specifications, such as a numeric format directive, as a minimum specification of the range and accuracy of the number representation instead of as an exact specification. An example of this method is shown in FIG. 2. In operation 201, a directive is received for data in a data processing operation, such as a DSP operation. This directive typically specifies a format such as a word length, a fixed point format or a floating point subtype with specified exponent and mantissa size. The directive may be received from a source code file which can be written in a variety of languages including C, C++, Matlab, VHDL, Verilog, model based diagram based on Simulink and other languages. One example is the HDL source code file 803 shown in FIG. 8. This source code file may be created by a designer who has written a design description in an input language or diagram to be implemented in an integrated circuit. In operation 203, the directive is treated as a minimum for the format, such as a minimum word length. This treatment occurs during the creation, in operation 205, of one or more representations of logic to perform the data processing operations, allowing the format in the data paths of the representation of the logic to exceed the minimum format in at least a portion of the representation of the logic. Optionally, as shown in operation 207, the output from the logic may be limited by the directive.

Figure 3:
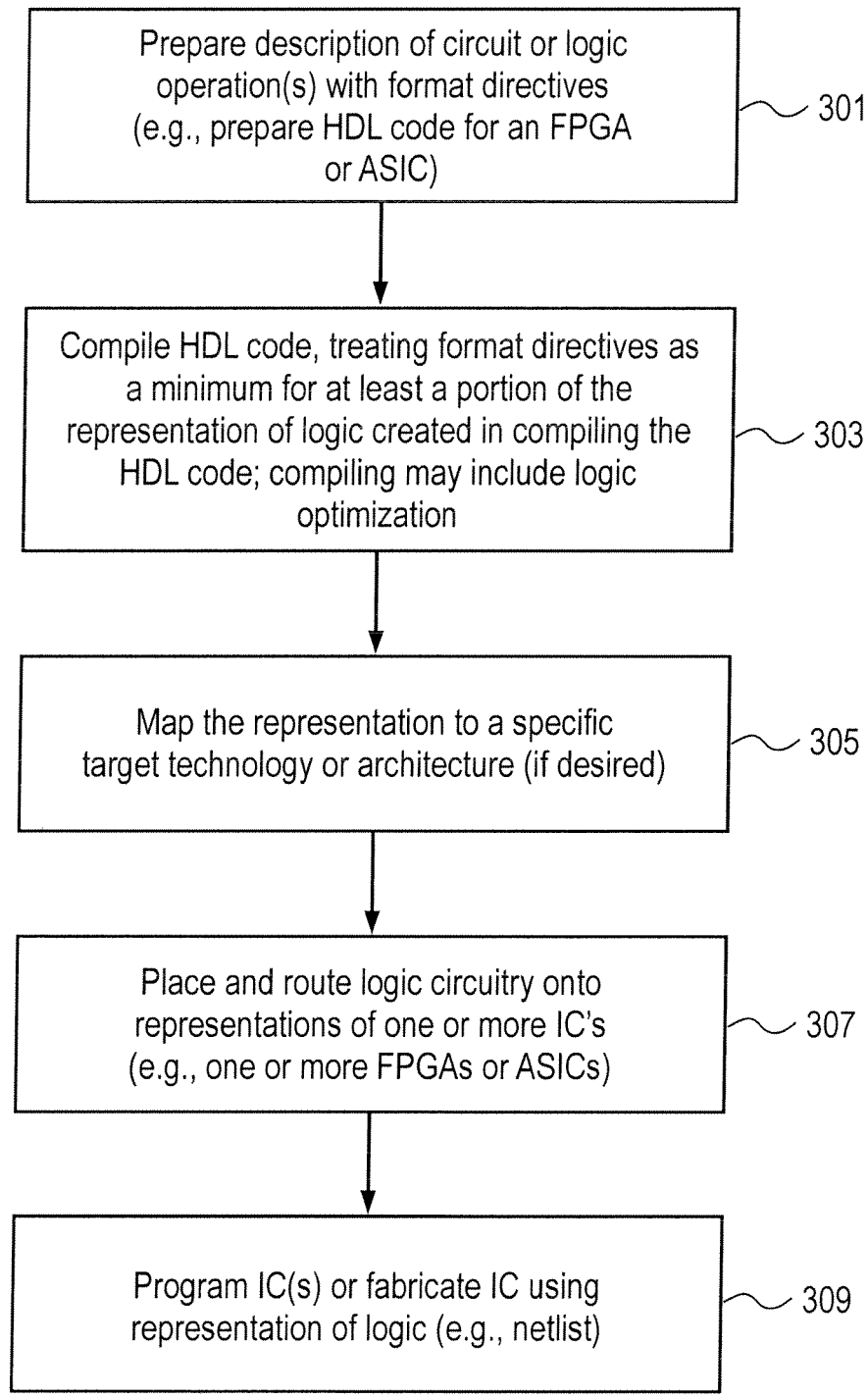
FIG. 3 is a flow chart which illustrates another method, according to the present invention, for using format directives.

FIG. 3 shows a method, according to one embodiment of the inventions, for creating a representation of logic. In this case, the logic is implemented in an integrated circuit rather than software; in other embodiments, the logic may be implemented in software which is executed on a general purpose data processing system, such as a general purpose computer. In operation 301, a designer prepares a description of the circuit or logic operations with numeric format directives. This may involve preparing C, C++, Matlab, computation diagram or HDL code for an FPGA or an ASIC or several such integrated circuits. Then in operation 303, the design description is compiled, treating the format directives as a minimum for at least a portion of the representation of logic created in compiling the input design. The compiling may include logic optimization. As further described below, this logic optimization may dictate or determine whether or not a format directive is to be treated as a minimum within an implementation of optimized logic as described, for example, in FIGS. 4A and 4C. In operation 305, a data processing system may map the representation created by the compilation in operation 303 to a specific target technology or architecture, if this is desired. Then the data processing system, in operation 307, may perform a place and route operation in which the logic circuitry is placed and routed onto representations of one or more integrated circuits, as is known in the art. The representations of the circuitry may be tested or simulated, and then an integrated circuit may be programmed or fabricated, in operation 309, using the representation of logic, which may be a netlist or other known forms of such representations. Further information with respect to processes for designing integrated circuits through the use of HDL and the compilation of HDL are described in U.S. Pat. No. 6,438,735, which is hereby incorporated herein by reference.

Figure 4A:
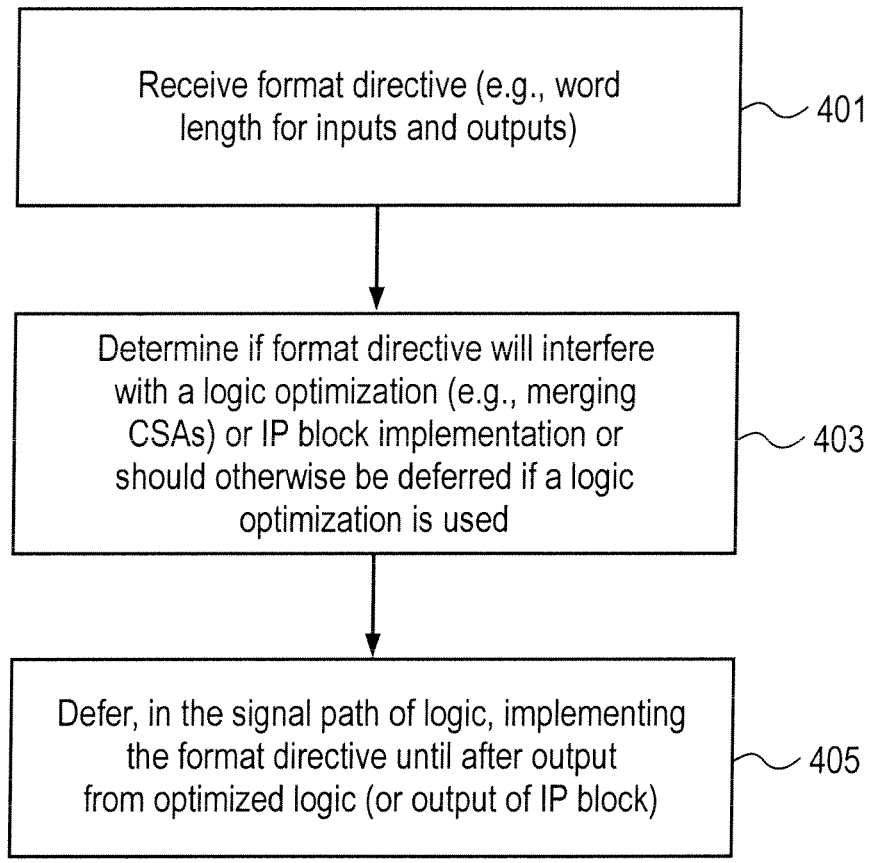
FIG. 4A is a flow chart illustrating a method according to another aspect of the present inventions.
Figure 4B:
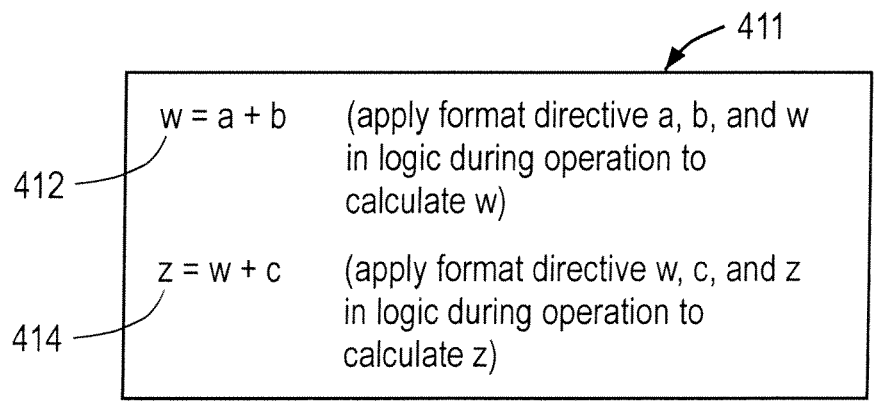
FIG. 4B illustrates a prior art approach to using format directives for a sequence of additions.
Figure 4C:
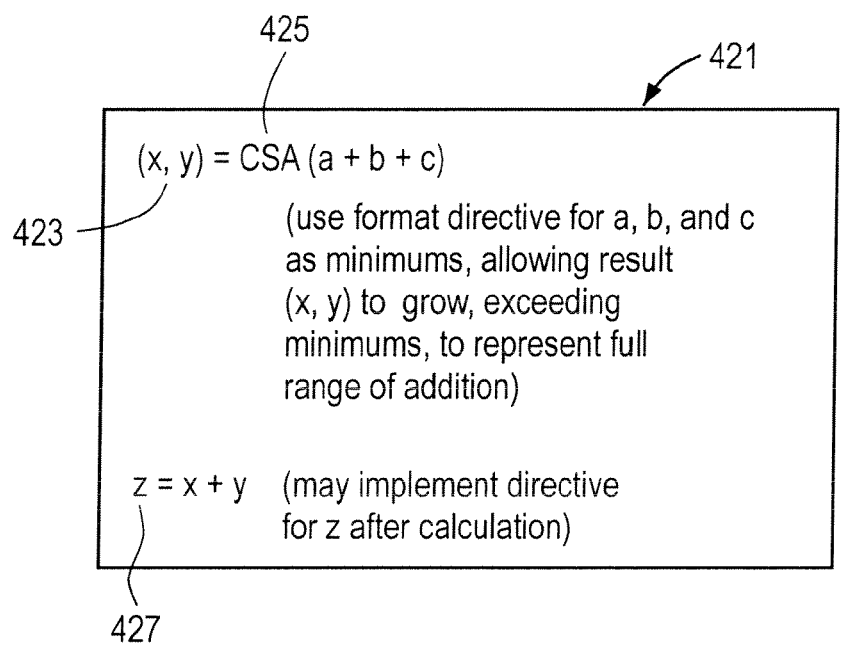
FIG. 4C shows an approach according to certain aspects of the invention which use format directives differently when a logic optimization is used, such as a logic optimization used for a sequence of additions.

In at least certain embodiments of the inventions, it may be desirable to determine whether or not particular types of optimizations can be used in creating logic for data processing operations, and if they can be used, then deciding to defer or completely override a format directive. For example, if the format directive interferes with an important logic optimization, then it may be desirable to defer use of the format directive as an exact specification at least within the data path of the optimized logic. FIGS. 4A, 4B and 4C illustrate one example of how logic optimization is used to decide whether or not a format directive is to be followed. In other words, if it is determined that certain logic optimizations are to be performed to create the implementation of the logic, then format directives applied to that logic will be either ignored or treated as a minimum format. In the method of FIG. 4A, operation 401 includes receiving a format directive, such as a word length for inputs and outputs within a data processing operation, such as a series of additions. In operation 403, it is determined whether the format directive will interfere with a logic optimization, such as the merging of carry-save adders which are used to implement a series of additions, or such as the use of an IP block implementation. The use of a format directive may interfere with or prevent the use of certain logic optimizations, such as the merging of carry and save adders and hence should be deferred if the logic optimization is to be used. If it is determined that the format directive will interfere, in operation 403, then the use of the format directive is at least deferred, within the signal path of the logic, until after the output from the optimized logic. This is shown in operation 405 of FIG. 4A. In other words, within at least a portion of the logic's signal path, the format directive is ignored or used as a minimum format, thereby allowing the word sizes to grow naturally as data is operated on. FIGS. 4B and 4C show how this aspect of at least certain embodiments of the present inventions differs from the prior art. As shown in FIG. 4B, a series of additions are limited by the application of a format directive. The addition 412 (W=A+B) is limited by format directives for the inputs A, B, and the output W such that logic which performs this addition uses the format directive as an exact format for word lengths for both the inputs and outputs when calculating W. The addition 414 takes the sum W and adds the value C to derive the output Z. In this case also, the format directive is applied as an exact format for both the inputs W and C and the output Z such that logic which implements the addition 414 limits the inputs and the outputs to the exact format specified by the format directive. This is to be contrasted with an embodiment of the present invention shown in FIG. 4C in which a logic optimization, in this case the merging of carry-save based operators, is determined to be a useful optimization and hence should cause at least the deferral, in the signal path of the optimized logic, of the implementation of the format directive. Further information in connection with carry-save based operators and the merging of such operators can be found in U.S. patent application Ser. No. 10/911,317, which was filed Aug. 3, 2004, which application is hereby incorporated herein by reference. Block 421, shown in FIG. 4C, shows how the sequence of additions shown in block 411 of FIG. 4B may be implemented through the use of a carry-save adder. The carry-save adder is an optimization of a series of additions. In other words, the additions 412 and 414 may be implemented as a carry-save adder function or operator 425 for the inputs A+B+C as shown in FIG. 4C to create an intermediate result 423, shown as (X,Y). The format directive for A, B, and C is used as a minimum, allowing the result (X,Y) to grow, exceeding the minimums, to represent the full range of the addition. No word length reduction is performed on the intermediate result (X,Y). In the operation 427, the output Z is calculated by adding X and Y, and optionally the output may implement the directive for the value Z after the calculation of Z. While the result is not equivalent at a bit level with the original specification, it is more accurate from a numerical perspective. If the format directive limited the format to 32.16 in the case of FIG. 4B, the format used in the carry-save operation will exceed that format in the method shown in FIG. 4C, but the output may implement that format or word length reduction if desired. It will be understood that a format directive may be any one of a variety of numeric formats in addition to simply a fixed point format.

Certain format reductions can actually consume, and hence "cost", additional circuit (e.g., IC) area for a design and can also add signal delays into the IC; for example, format reductions such as rounding or saturation consume additional IC area (due to the need to add quantization logic, for example) and introduce additional signal delays into the IC design. In certain embodiments described herein, format reductions are deferred in order to perform optimizations (such as carry save transforms); in other embodiments, the format reduction should be deferred without performing any optimizations in order to achieve a design result which has improved area consumption on the IC and less additional signal delay. An example of these other embodiments can be those format reductions, such as rounding and saturation, which will consume additional IC area and will add additional signal delay. Hence, in these other embodiments, such format reductions can be deferred without performing any optimization related to or in the signal path of these deferred format reductions, and this will result in a design with improved area and delay because the logic for the quantization operations (e.g., logic for rounding) is not inserted or is inserted less often.

Figure 5:
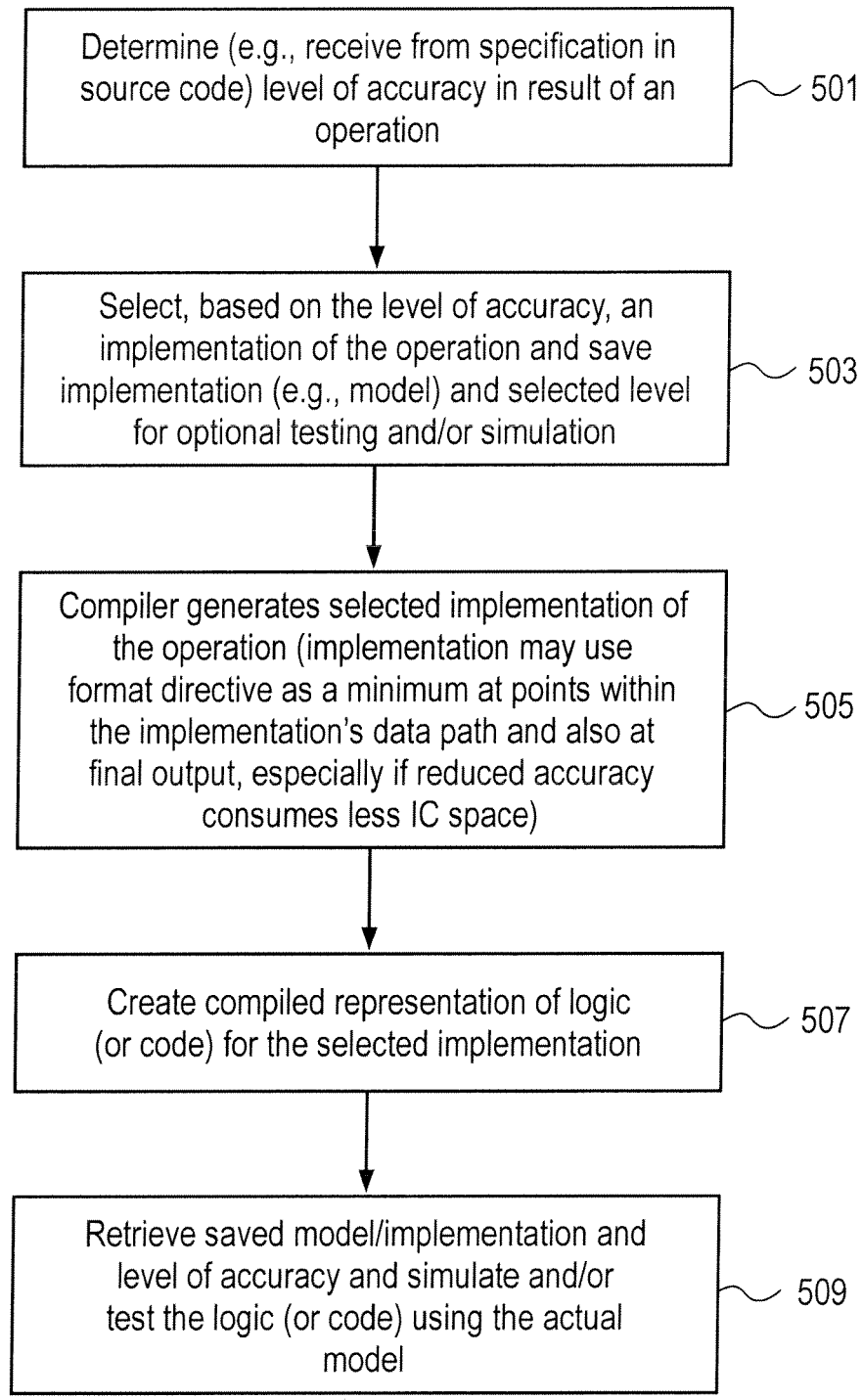
FIG. 5 shows a flow chart of an embodiment of a method according to another aspect of the present inventions.

Another aspect of the present inventions relates to how the format directive may be loose enough to enable changes on how an operation is implemented. An example of such an operation is the square root operation. If the result of the square root operation only needs to have an accuracy of 10%, then a range reduction followed by a combination of linear interpolation and table lookup may be able to satisfy the constraint more cheaply than a cordic implementation or a traditional bit exact method. In fact, flexibility in the specification, such as the specification of a format directive, enables a tool to choose between many possible operator implementations, such as a library of such implementations shown as library 809 in the computer readable medium 801 of FIG. 8. FIG. 5 shows an example of a method according to this aspect. In operation 501, the level of accuracy in a result of an operation is determined. This may be performed by receiving the desired level of accuracy from a specification of the accuracy in source code which describes the logic or operation, such as the source code 803 shown in the computer readable medium 801 of FIG. 8. In operation 503, the method selects, based on the level of accuracy determined in operation 501, an implementation (e.g. a model) of the operation. Operation 503 can save a representation of the selected implementation (e.g. a model) of the operation and can save a representation of the selected level of accuracy for optional testing and/or simulation in operation 509. Then in operation 505, a compiler generates the selected implementation of the operation. The compiler may use the format directive in the implementation as a minimum at points within the implementation's data path and also at the final output, especially if reduced accuracy consumes less integrated circuit space. Then in operation 507, a compiled representation of the logic or software is created for the selected implementation. Optionally, in operation 509, the saved model and level of accuracy can be retrieved and used to test and/or simulate the logic (or code) using the actual model.

Figure 6:
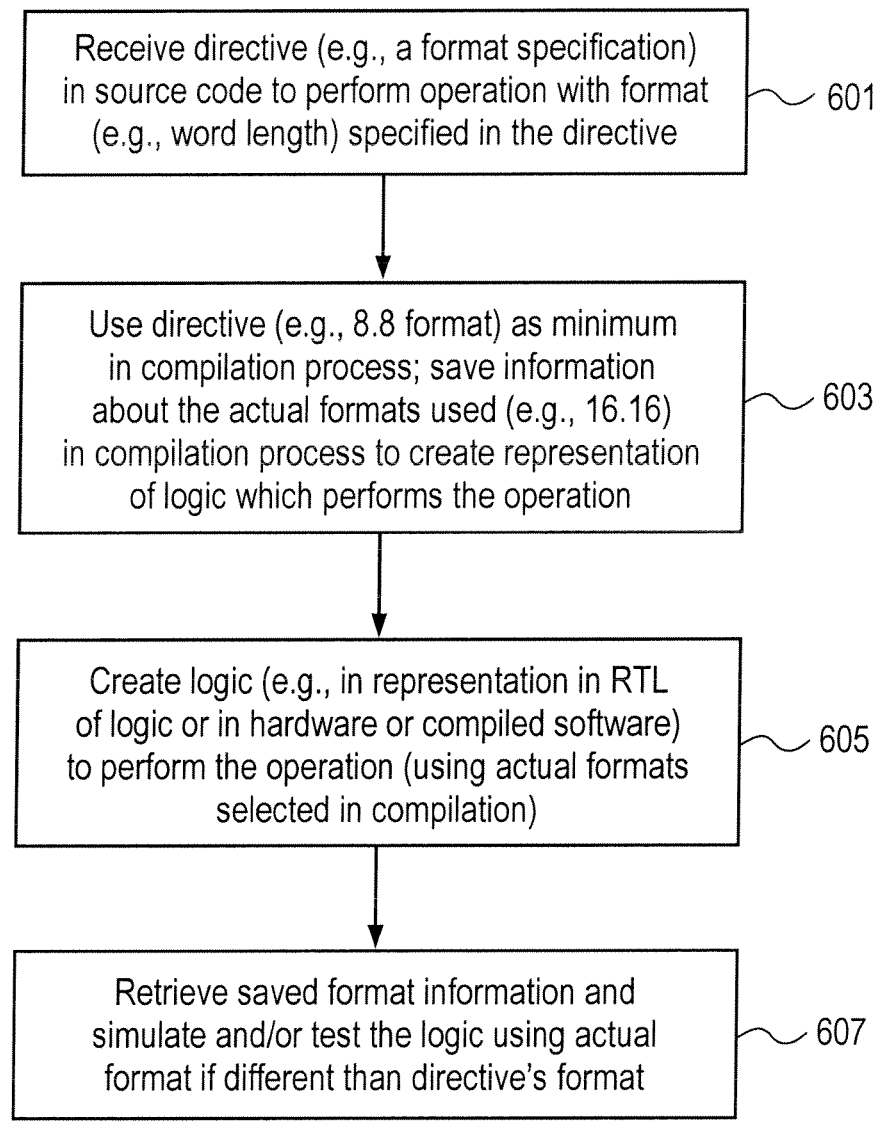
FIG. 6 is a flow chart which shows an embodiment of a method according to another aspect of the present inventions.

Another aspect of at least certain embodiments of the inventions relates to information specifying the use of formats which deviate from the format directive when simulating or testing logic created from the deviated format. The flow chart of FIG. 6 is an example of an embodiment which uses this type of information. In operation 601, a directive, such as a format specification, is received from source code, such as HDL source code; this directive specifies that one or more operations are to be performed with a format, such as a word length, specified in the directive. In operation 603, the directive is used as a minimum in the compilation process which synthesizes the logic, rather than as a exact requirement. Hence, the format used in synthesizing the logic may deviate from the format directive in the source code. Information about the actual formats used and how they deviated from the directive's format is saved in the compilation process, which can be used to create representations of the design in the original input language that are bit exact with the optimized design. In operation 605, the logic is created to perform the operation, using the actual format selected in the compilation process of operation 603. The logic may be represented in register transfer level (RTL) or in other forms. The information saved in operation 603 may then be used in operation 607 during the simulation and/or testing of the logic using the actual format if it is different than the directive's format. For example, logic created in operation 605 may be tested or simulated with data in a 32.16 format if 32.16 was used in compiling the source code to create the logic rather than the specified 16.8 format which is specified in the directive in the source code received in operation 601. An example of the saved information used in operation 607 is shown as stored directive information 813, which is stored in the computer readable medium 801 shown in FIG. 8.

Figure 9:
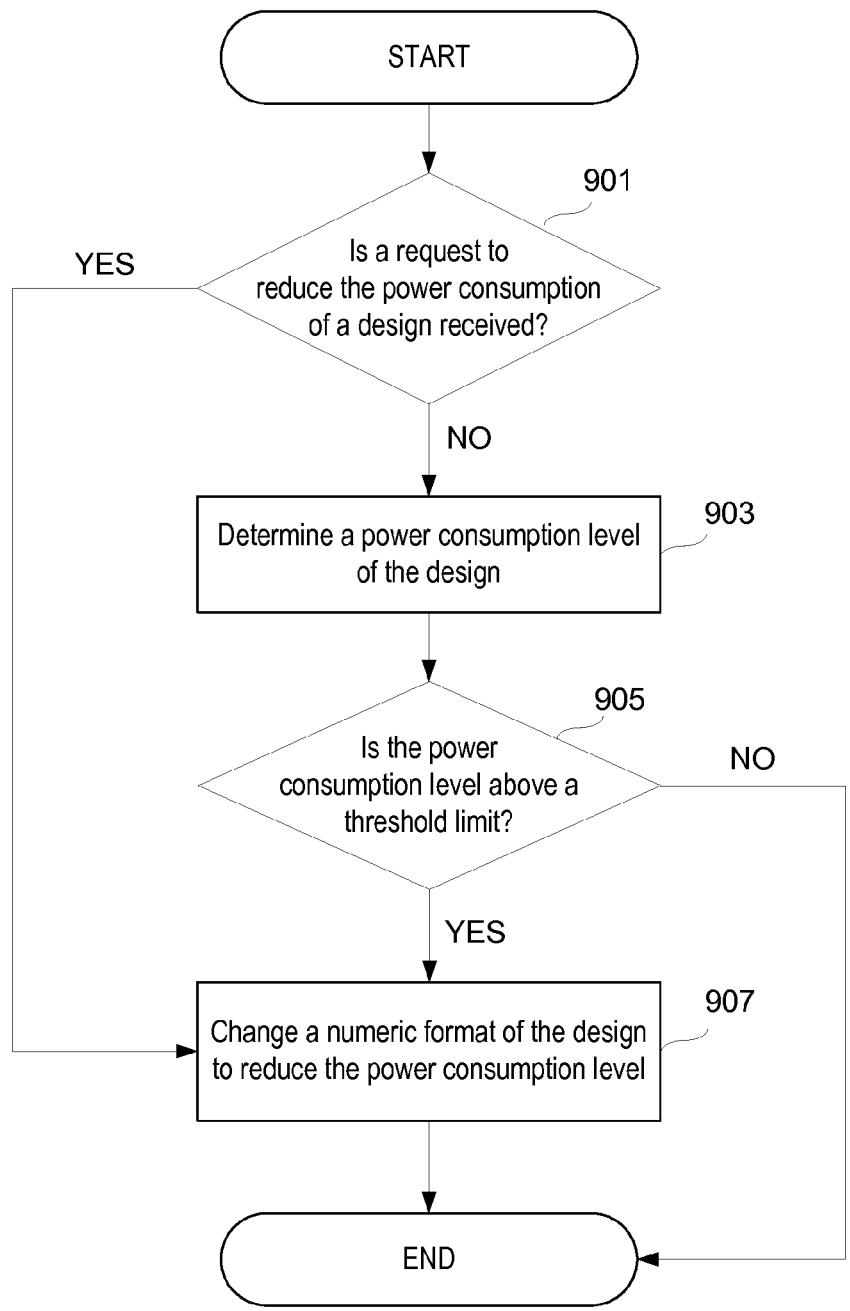
FIG. 9 is a flow chart that illustrates a method, according to the present invention, for improving power consumption.

A further aspect of at least certain embodiments of the present inventions relates to changing the numeric format of a design to reduce power consumption. FIG. 9 shows an example of a method according to this aspect. At least in some embodiments, it is determined if a request to reduce the power consumption of a design of a circuit is received at decision block 901. If a request is received, the process continues to block 907 to change the numeric format of the design to reduce the power consumption level. If a request is not received, then in one embodiment, the power consumption level of the design is determined at block 903. If the power consumption level exceeds a threshold limit as determined at decision block 905, the process continues to block 907 to change the numeric format of the design to reduce the power consumption level. In one embodiment, the numeric format of the design is changed automatically in response to the determination that the power consumption of the design exceeds a threshold limit. In an exemplary embodiment, the design is a digital signal processing circuit, and the numeric format of the design is changed to a sign magnitude format. The change in the numeric format of the design may be performed, for example, by an HDL compiler in a data processing system.

At least one embodiment of the present invention seeks to optimize a circuit design through automated transformation so that carry-save techniques can be used in generating an improved and equivalent circuit. Examples and details are described herein.

Many of the methods of the present invention may be performed with a digital processing system, such as a conventional, general-purpose computer system. Special purpose computers which are designed or programmed to perform only one function may also be used.

Figure 1:
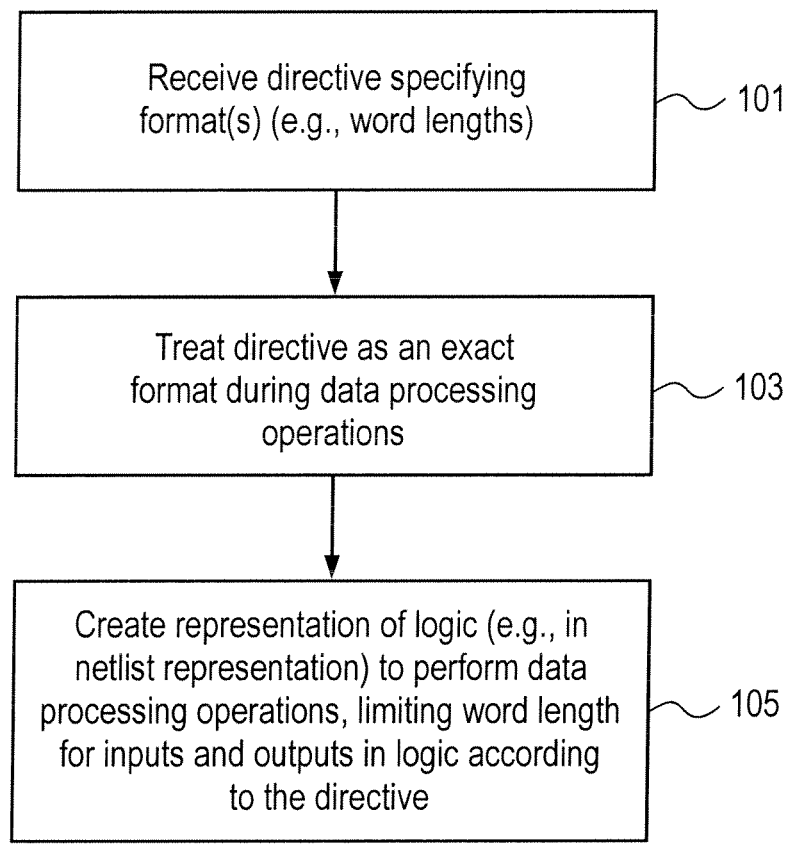
FIG. 1 is a flow chart which illustrates a method, in the prior art, for using format directives.
Figure 7:
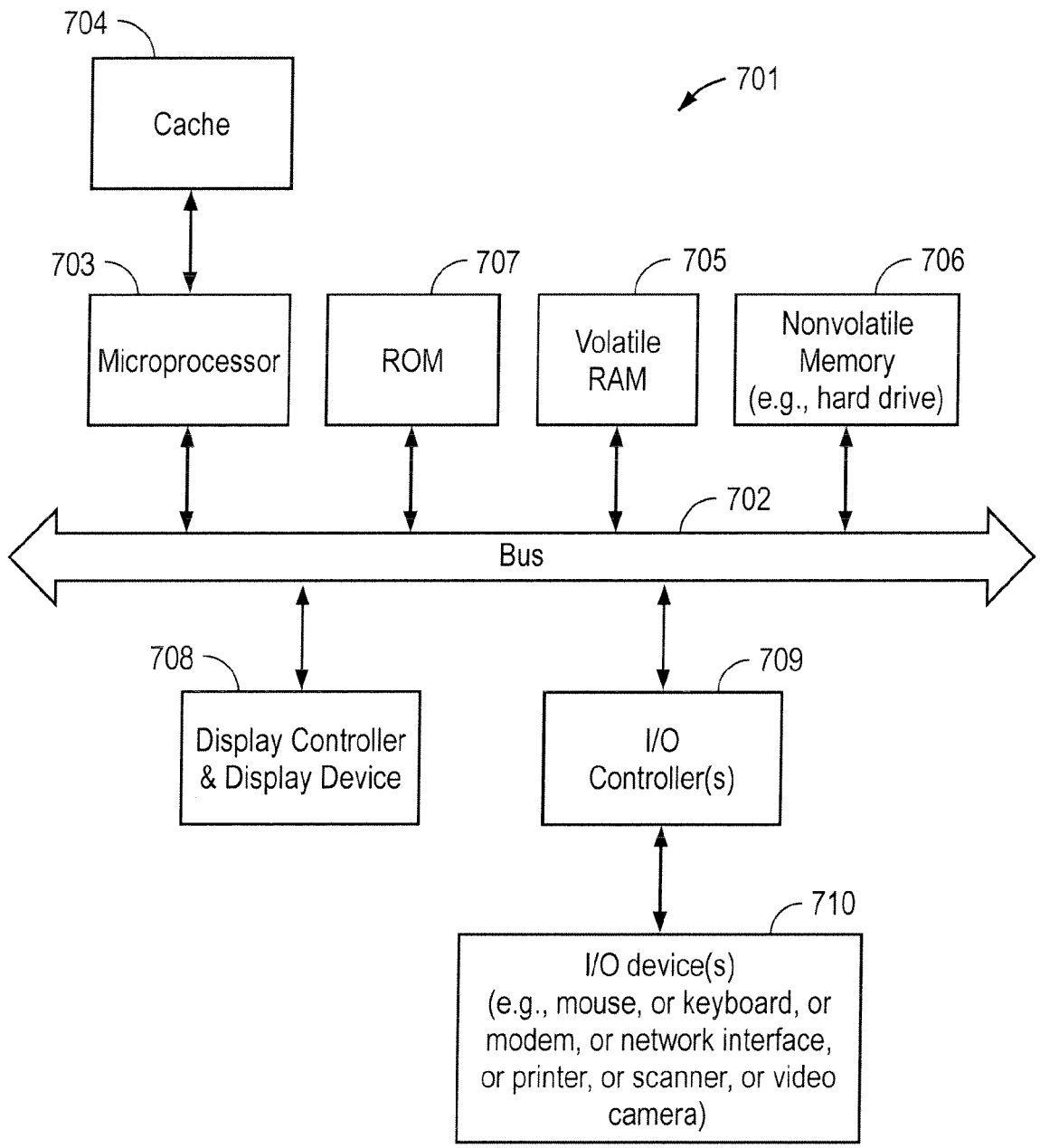
FIG. 7 shows an example of a data processing device or system which may be used to create representations of logic and to perform other methods described herein.

FIG. 7 shows one example of a typical computer system which may be used with the present invention. Note that while FIG. 7 illustrates various components of a computer system, it is not intended to represent any particular architecture or manner of interconnecting the components as such details are not germane to the present invention. It will also be appreciated that network computers and other data processing systems which have fewer components or perhaps more components may also be used with the present invention. The computer system of FIG. 1 may, for example, be an Apple Macintosh computer, a Sun workstation, or a personal computer (PC) running a Windows operating system.

As shown in FIG. 7, the computer system 701, which is a form of a data processing system, includes a bus 702 which is coupled to a microprocessor 703 and a ROM 707 and volatile RAM 705 and a non-volatile memory 706. The microprocessor 703, which may be a microprocessor from Intel or Motorola, Inc. or IBM is coupled to cache memory 704 as shown in the example of FIG. 7. The bus 702 interconnects these various components together and also interconnects these components 703, 707, 705, and 706 to a display controller and display device 708 and to peripheral devices such as input/output (I/O) devices which may be mice, keyboards, modems, network interfaces, printers, scanners, video cameras and other devices which are well known in the art. Typically, the input/output devices 710 are coupled to the system through input/output controllers 709. The volatile RAM 705 is typically implemented as dynamic RAM (DRAM) which requires power continually in order to refresh or maintain the data in the memory. The non-volatile memory 706 is typically a magnetic hard drive or a magnetic optical drive or an optical drive or a DVD RAM or other type of memory systems which maintain data even after power is removed from the system. Typically, the non-volatile memory will also be a random access memory although this is not required. While FIG. 7 shows that the non-volatile memory is a local device coupled directly to the rest of the components in the data processing system, it will be appreciated that the present invention may utilize a non-volatile memory which is remote from the system, such as a network storage device which is coupled to the data processing system through a network interface such as a modem or Ethernet interface. The bus 702 may include one or more buses connected to each other through various bridges, controllers and/or adapters as is well known in the art. In one embodiment the I/O controller 709 includes a USB (Universal Serial Bus) adapter for controlling USB peripherals, and/or an IEEE-1394 bus adapter for controlling IEEE-1394 peripherals.

It will be apparent from this description that aspects of the present invention may be embodied, at least in part, in software. That is, the techniques may be carried out in a computer system or other data processing system in response to its processor, such as a microprocessor, executing sequences of instructions contained in a memory, such as ROM 707, volatile RAM 705, non-volatile memory 706, cache 704 or a remote storage device. In various embodiments, hardwired circuitry may be used in combination with software instructions to implement the present invention. Thus, the techniques are not limited to any specific combination of hardware circuitry and software nor to any particular source for the instructions executed by the data processing system. In addition, throughout this description, various functions and operations are described as being performed by or caused by software code to simplify description. However, those skilled in the art will recognize what is meant by such expressions is that the functions result from execution of the code by a processor, such as the microprocessor 703.

Figure 8:
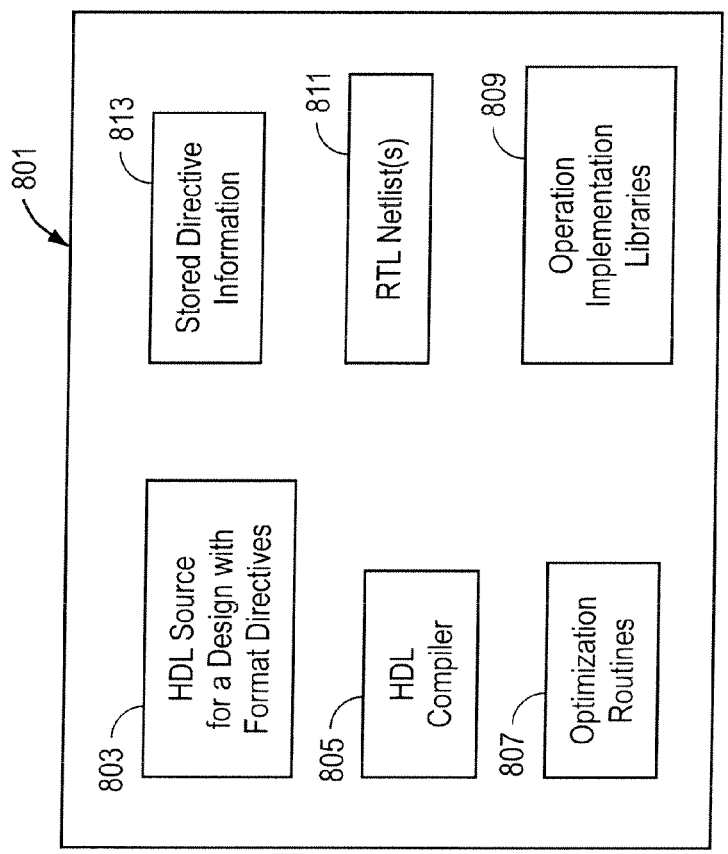
FIG. 8 shows an example of a computer readable medium containing executable program instructions and data and source code for performing one or more of the methods described herein.

A machine readable medium, such as the computer readable medium 801 shown in FIG. 8, can be used to store software and data which when executed by a data processing system causes the system to perform various methods of the present invention. The medium 801 may store executable software and data for use in a circuit design process such as a computer-aided design of ICs, and this software may include an HDL compiler 805 and optimization routines 807 which compile and optimize a design, such as a design specified by HDL source code 803 in order to produce a representation of the designed logic, such as the RTL netlist 811. This executable software and data may be stored in various places including for example ROM 707, volatile RAM 705, non-volatile memory 706 and/or cache 704 as shown in FIG. 7. Portions of this software and/or data may be stored in any one of these storage devices.

Thus, a machine readable medium includes any mechanism that provides (i.e., stores and/or transmits) information in a form accessible by a machine (e.g., a computer, network device, personal digital assistant, manufacturing tool, any device with a set of one or more processors, etc.). For example, a machine readable medium includes recordable/non-recordable media (e.g., read only memory (ROM); random access memory (RAM); magnetic disk storage media; optical storage media; flash memory devices; etc.).

In the foregoing specification, the invention has been described with reference to specific exemplary embodiments thereof. It will be evident that various modifications may be made thereto without departing from the broader spirit and scope of the invention as set forth in the following claims. The specification and drawings are, accordingly, to be regarded in an illustrative sense rather than a restrictive sense.

What is claimed is:

1. A non-transitory computer readable medium containing executable program instructions which cause a data processing system to perform a method comprising:
   determining by the data processing system a directive which specifies a numeric format indicating a first word length for data in a data processing operation; and
   creating by the data processing system a representation of logic to perform the data processing operation, the creating using the directive as a minimum format requirement for at least a portion of the representation of logic that allows an actual format for at least a portion of the data in the data processing operation to exceed the first word length.

2. The non-transitory computer readable medium as in claim 1, wherein the determining includes reading the directive from a source code file, and wherein the method further comprises:
   storing the representation of logic in a computer storage device for use in creating at least one integrated circuit.

3. The non-transitory computer readable medium as in claim 2, wherein the method further comprises:
   saving information specifying actual formats, which are different than formats in the directive, used in creating the representation of logic, the information to be used in at least one of simulating and testing the representation of logic.

4. The non-transitory computer readable medium as in claim 2, wherein the method further comprises:
   determining whether a logic optimization is to be used in creating the representation of logic; and
   deferring in a signal path of the logic a reduction in the actual format to the numeric format specified by the directive, in response to the logic optimization being implemented in the representation of logic.

5. The non-transitory computer readable medium as in claim 1, wherein the portion of the representation of logic comprises a merged carry-save adder.

6. The non-transitory computer readable medium as in claim 1, wherein the directive is used as the minimum format requirement within internal inputs in the portion of the representation of logic.

7. The non-transitory computer readable medium as in claim 1, wherein the representation of logic includes an output which is limited to the directive as an exact format.

8. The non-transitory computer readable medium as in claim 1, wherein the numeric format specifies a word length having a first value and the at least the portion of the representation of logic uses the word length having a second value, which is larger than the first value.

9. A machine implemented method comprising:
   determining by a data processing system a directive which specifies a numeric format indicating a first word length for data in a data processing operation; and creating, by a data processing system, a representation of logic to perform the data processing operation, the creating using the directive as a minimum format requirement for at least a portion of the representation of logic that allows an actual format for at least a portion of the data in the data processing operation to exceed the first word length.

10. The machine implemented method as in claim 9, wherein the determining includes reading the directive from a source code file, and wherein the method further comprises:
storing the representation of logic in a computer storage device for use in creating at least one integrated circuit.

11. The machine implemented method as in claim 10, wherein the method further comprises:
saving information specifying actual formats, which are different than formats in the directive, used in creating the representation of logic, the information to be used in at least one of simulating and testing the representation of logic.

12. The machine implemented method as in claim 10, wherein the method further comprises:
determining whether a logic optimization is to be used in creating the representation of logic; and
deferring in a signal path of the logic a reduction in the actual format to the numeric format specified by the directive, in response to the logic optimization being implemented in the representation of logic.

13. The machine implemented method as in claim 10, further comprising:
deferring in a signal path of the logic a reduction in the actual format to the numeric format specified by the directive, while not performing a logic optimization in the signal path.

14. The machine implemented method as in claim 9, wherein the portion of the representation of logic comprises a merged carry-save adder.

15. The machine implemented method as in claim 9, wherein the directive is used as the minimum format requirement within internal inputs in the portion of the representation of logic.

16. The machine implemented method as in claim 9, wherein the representation of logic includes an output which is limited to the directive as an exact format.

17. The machine implemented method as in claim 9, wherein the numeric format specifies a word length having a first value and the at least the portion of the representation of logic uses the word length having a second value, which is larger than the first value.

18. A data processing system comprising:
means for determining a directive which specifies a numeric format indicating a first word length for data in a data processing operation; and
means for creating a representation of logic to perform the data processing operation, the creating using the directive as a minimum format requirement for at least a portion of the representation of logic that allows an actual format for at least a portion of the data in the data processing operation to exceed the first word length, wherein each of the means for determining and the means for creating comprises a processor.

19. The data processing system as in claim 18, wherein the means for determining includes means for reading the directive from a source code file, and wherein the data processing system further comprises:
means for storing the representation of logic in a computer storage device for use in creating at least one integrated circuit.

20. The data processing system as in claim 19, wherein the data processing system further comprises:
means for saving information specifying actual formats, which are different than formats in the directive, used in creating the representation of logic, the information to be used in at least one of simulating and testing the representation of logic.

21. The data processing system as in claim 19, wherein the data processing system further comprises:
means for determining whether a logic optimization is to be used in creating the representation of logic; and
means for deferring in a signal path of the logic a reduction in the actual format specified by the directive, in response to the logic optimization being implemented in the representation of logic.

22. The data processing system as in claim 18, wherein the portion of the representation of logic comprises a merged carry-save adder.

23. The data processing system as in claim 18, wherein the directive is used as the minimum format requirement within internal inputs in the portion of the representation of logic.

24. The data processing system as in claim 18, wherein the representation of logic includes an output which is limited to the directive as an exact format.

25. The data processing system as in claim 18, wherein the numeric format specifies a word length having a first value and the at least the portion of the representation of logic uses the word length having a second value, which is larger than the first value.

26. A non-transitory computer readable medium containing executable program instructions which cause a data processing system to perform a method comprising:
determining, by the data processing system, a numeric format directive specifying a level of requested accuracy that indicates a first word length for a result of a data processing operation;
selecting, by the data processing system based on the level of requested accuracy, an implementation of the data processing operation from a library of implementations of the data processing operation; and
creating, by the data processing system, a representation of logic to provide the selected implementation, the selected implementation using the numeric format directive as a minimum format requirement for at least a portion of the representation of logic that allows an actual format for at least a portion of the data in the data processing operation to exceed the first word length.

27. The non-transitory computer readable medium as in claim 26, wherein the creating comprises compiling a description in a hardware description language.

28. The non-transitory computer readable medium as in claim 27, wherein the numeric format directive is specified in the description, and wherein the method further comprises:
saving a representation of the selected implementation and saving the level of requested accuracy; and
performing at least one of a test or simulation of the logic using the representation of the selected implementation.

29. The non-transitory computer readable medium as in claim 28, wherein the determining includes reading the level from a source code file.

30. The non-transitory computer readable medium as in claim 29, wherein the method further comprises:
determining whether a logic optimization is to be used in creating the representation of logic; and
deferring in a signal path of the logic a reduction in the actual format to the level of requested accuracy specified by the numeric format directive, in response to the logic optimization being implemented in the representation of logic.

31. The non-transitory computer readable medium as in claim 29, wherein the method further comprises:
creating, in the at least a portion of the representation of logic, data paths having a word length larger than a word length specified by the numeric format directive if the selected implementation will consume less space in an integrated circuit than another implementation.

32. The non-transitory computer readable medium as in claim 26, wherein the representation of logic includes an output which is limited to the numeric format directive as an exact format.

33. The non-transitory computer readable medium as in claim 26, wherein the numeric format directive specifies a word length having a first value and the at least the portion of the representation of logic uses the word length having a second value, which is larger than the first value.

34. A machine implemented method comprising:
determining, by a data processing system, a numeric format directive specifying a level of requested accuracy that indicates a first word length for a result of a data processing operation;
selecting, by the data processing system based on the level of requested accuracy, an implementation of the data processing operation from a library of implementations of the data processing operation; and
creating, by the data processing system, a representation of logic to provide the selected implementation, wherein the selected implementation uses the numeric format directive as a minimum format requirement for at least a portion of the representation of logic that allows an actual format for at least a portion of the data in the data processing operation to exceed the first word length.

35. The machine implemented method as in claim 34, wherein the creating comprises compiling a description in a hardware description language.

36. The machine implemented method as in claim 35, wherein the numeric format directive is specified in the description, and wherein the method further comprises:
saving a representation of the selected implementation and saving the level of requested accuracy; and
performing at least one of a test or simulation of the logic using the representation of the selected implementation.

37. The machine implemented method as in claim 36, wherein the determining includes reading the level from a source code file.

38. The machine implemented method as in claim 37, wherein the method further comprises:
determining whether a logic optimization is to be used in creating the representation of logic; and
deferring in a signal path of the logic a reduction in the actual format to the level of requested accuracy specified by the numeric format directive, in response to the logic optimization being implemented in the representation of logic.

39. The machine implemented method as in claim 37, wherein the method further comprises:
creating, in the at least a portion of the representation of logic, data paths having a word length larger than a word length specified by the numeric format directive if the selected implementation will consume less space in an integrated circuit than another implementation.

40. The machine implemented method as in claim 34, wherein the representation of logic includes an output which is limited to the numeric format directive as an exact format.

41. The machine implemented method as in claim 34, wherein the numeric format directive specifies a word length having a first value and the at least the portion of the representation of logic uses the word length having a second value, which is larger than the first value.

42. A data processing system comprising:
means for determining a numeric format directive specifying a level of requested accuracy that indicates a first word length for a result of a data processing operation;
means for selecting, based on the level of requested accuracy, an implementation of the data processing operation from a library of implementations of the data processing operation; and
means for creating a representation of logic to provide the selected implementation, wherein the selected implementation uses the numeric format directive as a minimum format requirement for at least a portion of the representation of logic that allows an actual format for at least a portion of the data in the data processing operation to exceed the first word length, wherein each of the means for determining, the means for selecting, and the means for creating comprises a processor.

43. The data processing system as in claim 42, wherein the means for creating comprises means for compiling a description in a hardware description language.

44. The data processing system as in claim 43, wherein the numeric format directive is specified in the description.

45. The data processing system as in claim 44, wherein the means for determining includes means for reading the level from a source code file.

46. The data processing system as in claim 45, wherein the data processing system further comprises:
means for determining whether a logic optimization is to be used in creating the representation of logic; and
means for deferring in a signal path of the logic a reduction in the actual format to the level of requested accuracy specified by the numeric format directive, in response to the logic optimization being implemented in the representation of logic.

47. The data processing system as in claim 45, wherein the data processing system further comprises:
means for creating, in the at least a portion of the representation of logic, data paths having a word length larger than a word length specified by the numeric format directive if the selected implementation will consume less space in an integrated circuit than another implementation.

48. The data processing system as in claim 42, wherein the representation of logic includes an output which is limited to the numeric format directive as an exact format.

49. The data processing system as in claim 42, wherein the numeric format directive specifies a word length having a first value and the at least the portion of the representation of logic uses the word length having a second value, which is larger than the first value.

50. A non-transitory computer readable storage medium storing executable program instructions which, when executed, cause a data processing system to perform a method for designing a circuit, the method comprising:
determining, by the data processing system, a power consumption level of a design of the circuit; and
changing, by the data processing system, a first numeric format indicating a first word length for a first representation of numbers in a data processing operation used in the design to a second numeric format indicating a second word length for a second representation of numbers in the data processing operation in response to determining the power consumption level.

51. The non-transitory computer readable storage medium as in claim 50, wherein the changing of the first numeric format is performed in order to reduce power consumption and is performed automatically in response to determining that the power consumption level exceeds a limit.

52. The non-transitory computer readable storage medium as in claim 51, wherein the second numeric format is a sign magnitude format and wherein the design is for performing digital signal processing.

53. A non-transitory computer readable storage medium storing executable program instructions which, when executed, cause a data processing system to perform a method for designing a circuit, the method comprising:
  receiving, by the data processing system, a request to reduce power consumption of a design for the circuit; and
  changing, by the data processing system, a first numeric format indicating a first word length for a first representation of numbers in a data processing operation used in the design to a second numeric format indicating a second word length for a second representation of numbers in the data processing operation in response to receiving the request.

54. The non-transitory computer readable storage medium as in claim 53, wherein the changing reduces the power consumption of the design.

55. A method for designing a circuit, the method comprising:
  determining, by a data processing system, a power consumption level of a design of the circuit; and
  changing, by the data processing system, a first numeric format indicating a first word length for a first representation of numbers in a data processing operation used in the design to a second numeric format indicating a second word length for a second representation of numbers in the data processing operation in response to determining the power consumption level.

56. The method as in claim 55, wherein the changing of the numeric format is performed in order to reduce power consumption and is performed automatically in response to determining that the power consumption level exceeds a limit.

57. The method as in claim 56, wherein the second numeric format is a sign magnitude format and wherein the design is for performing digital signal processing.

58. A method for designing a circuit, the method comprising:
  receiving, by a data processing system, a request to reduce power consumption of a design for the circuit; and
  changing, by the data processing system, a first numeric format associated with a first representation of numbers in a data processing operation used in the design to a second numeric format associated with a second representation of numbers in the data processing operation in response to receiving the request.

59. The method as in claim 58, wherein the changing reduces power consumption of the design.

* * * * *